United States Patent
Itazawa et al.

(10) Patent No.: US 8,467,187 B2
(45) Date of Patent: Jun. 18, 2013

(54) FLAT-PANEL DISPLAY APPARATUS INCLUDING A HEAT RADIATOR

(75) Inventors: Toshiaki Itazawa, Yamato (JP); Kunio Sakurai, Abiko (JP); Kiyoshi Kumagai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 12/646,832

(22) Filed: Dec. 23, 2009

(65) Prior Publication Data

US 2010/0177479 A1 Jul. 15, 2010

(30) Foreign Application Priority Data

Jan. 9, 2009 (JP) ................................. 2009-003998

(51) Int. Cl.
*H05K 7/20* (2006.01)
*H01J 7/24* (2006.01)

(52) U.S. Cl.
USPC ........... 361/690; 361/695; 361/701; 361/703; 361/719; 165/80.3; 257/713; 257/722; 174/16.1; 174/547; 454/184; 313/33; 313/46

(58) Field of Classification Search
USPC ......... 361/690, 694–697, 701–703, 717–719, 361/679.48–679.51; 165/80.2–80.3; 257/712–713, 721–722; 174/15.1, 16.1, 547, 174/252; 454/184; 313/33, 46
See application file for complete search history.

(56) References Cited

U.S. PATENT DOCUMENTS

| | | | | |
|---|---|---|---|---|
| 6,490,161 | B1 * | 12/2002 | Johnson ........................ | 361/704 |
| 7,164,586 | B2 * | 1/2007 | Lin ............................... | 361/714 |
| 7,561,427 | B2 * | 7/2009 | Jeong ............................ | 361/704 |
| 7,667,964 | B2 * | 2/2010 | Kang et al. ..................... | 361/692 |
| 7,755,893 | B2 * | 7/2010 | Yanagawa et al. ............ | 361/695 |
| 7,817,425 | B2 * | 10/2010 | Jeong ............................ | 361/704 |
| 2004/0036819 | A1 * | 2/2004 | Ryu et al. ........................ | 349/58 |
| 2005/0047067 | A1 * | 3/2005 | Bang et al. ..................... | 361/681 |
| 2006/0291153 | A1 * | 12/2006 | Bae ................................ | 361/681 |
| 2007/0081109 | A1 * | 4/2007 | Igarashi .......................... | 349/58 |
| 2007/0216273 | A1 * | 9/2007 | Yanagawa et al. ............. | 313/46 |
| 2007/0230118 | A1 * | 10/2007 | Leija et al. .................... | 361/690 |
| 2007/0258199 | A1 * | 11/2007 | Jeong ............................. | 361/681 |
| 2008/0285222 | A1 * | 11/2008 | Yeo et al. ....................... | 361/681 |
| 2010/0172098 | A1 * | 7/2010 | Isoshima et al. .............. | 361/697 |

FOREIGN PATENT DOCUMENTS

| | | |
|---|---|---|
| JP | 11-052872 A | 2/1999 |
| JP | 2001-022281 A | 1/2001 |
| JP | 2001-035397 A | 2/2001 |

(Continued)

*Primary Examiner* — Zachary M Pape

(74) *Attorney, Agent, or Firm* — Cowan, Liebowitz & Latman, P.C.

(57) ABSTRACT

A flat-panel display apparatus comprises a display panel, a circuit board, and a cover. The circuit board includes a first and second circuit boards. The first circuit board is arranged above the second circuit board so that, on the back side of the display panel, a mounting surfaces of the first and second circuit boards are approximately in parallel with a display surface of the display panel and do not overlap each other. Each of the first and second circuit boards have a primary mounting surface on which a large number of electrical components are mounted, and a secondary mounting surface that is opposite the primary mounting surface. The primary mounting surface of the first circuit board is arranged in an inverted orientation to the primary mounting surface of the second circuit board. A radiator with fins is provided on the secondary mounting surface side of the first circuit board.

20 Claims, 9 Drawing Sheets

FOREIGN PATENT DOCUMENTS

| JP | 2001-053468 A | 2/2001 |
| JP | 2002-006754 A | 1/2002 |
| JP | 2002-341777 | 11/2002 |
| JP | 2003-162228 A | 6/2003 |
| JP | 2005-107438 A | 4/2005 |
| JP | 2007-078867 A | 3/2007 |
| JP | 2007-174506 A | 7/2007 |
| JP | 2008-197391 A | 8/2008 |
| JP | 2008-197392 A | 8/2008 |
| JP | 2008-205344 A | 9/2008 |

* cited by examiner

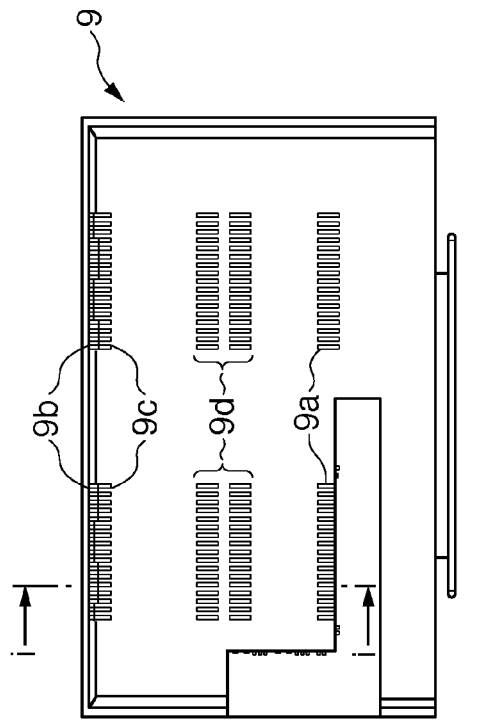
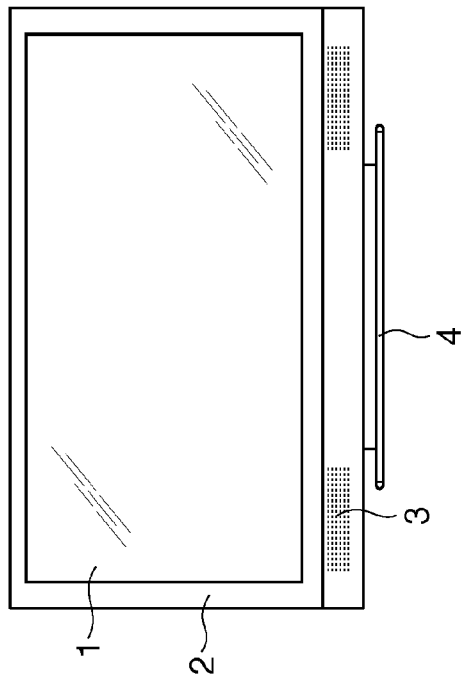

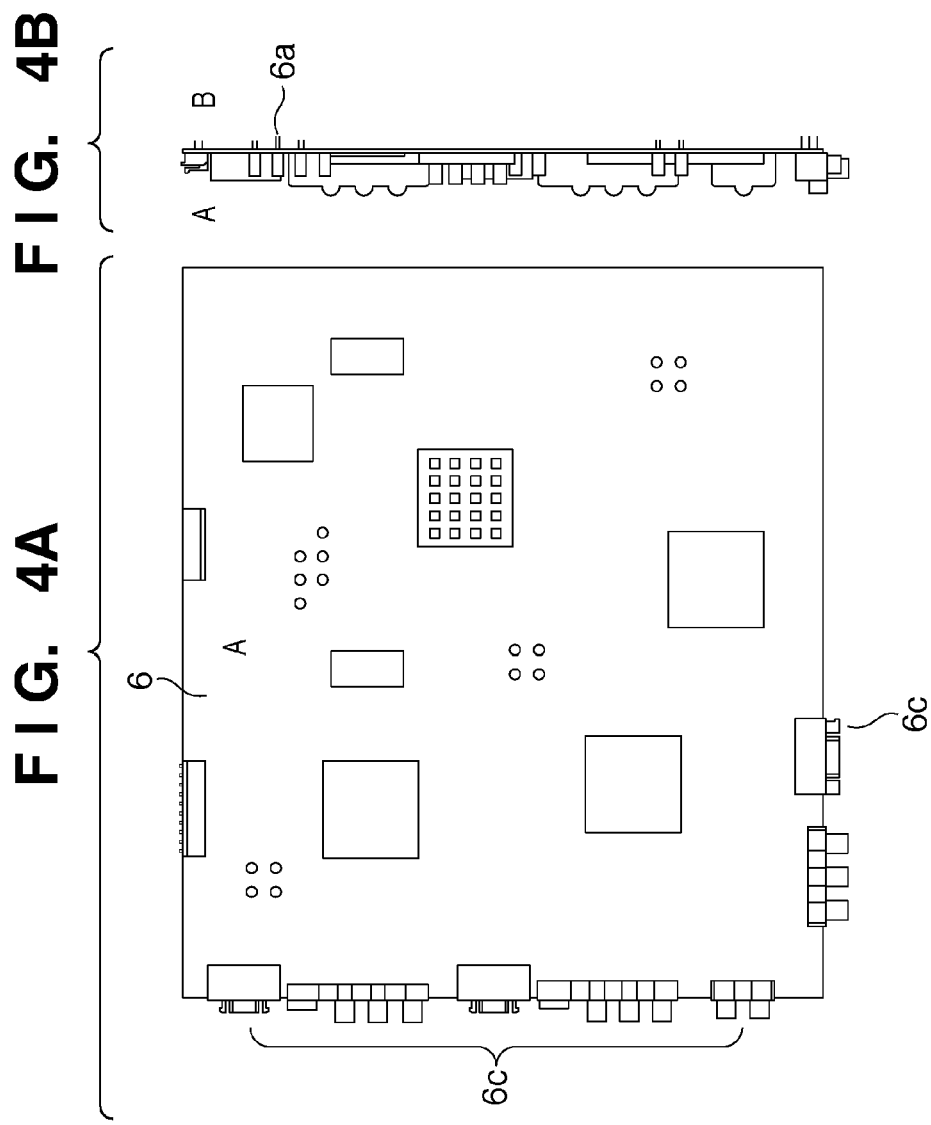

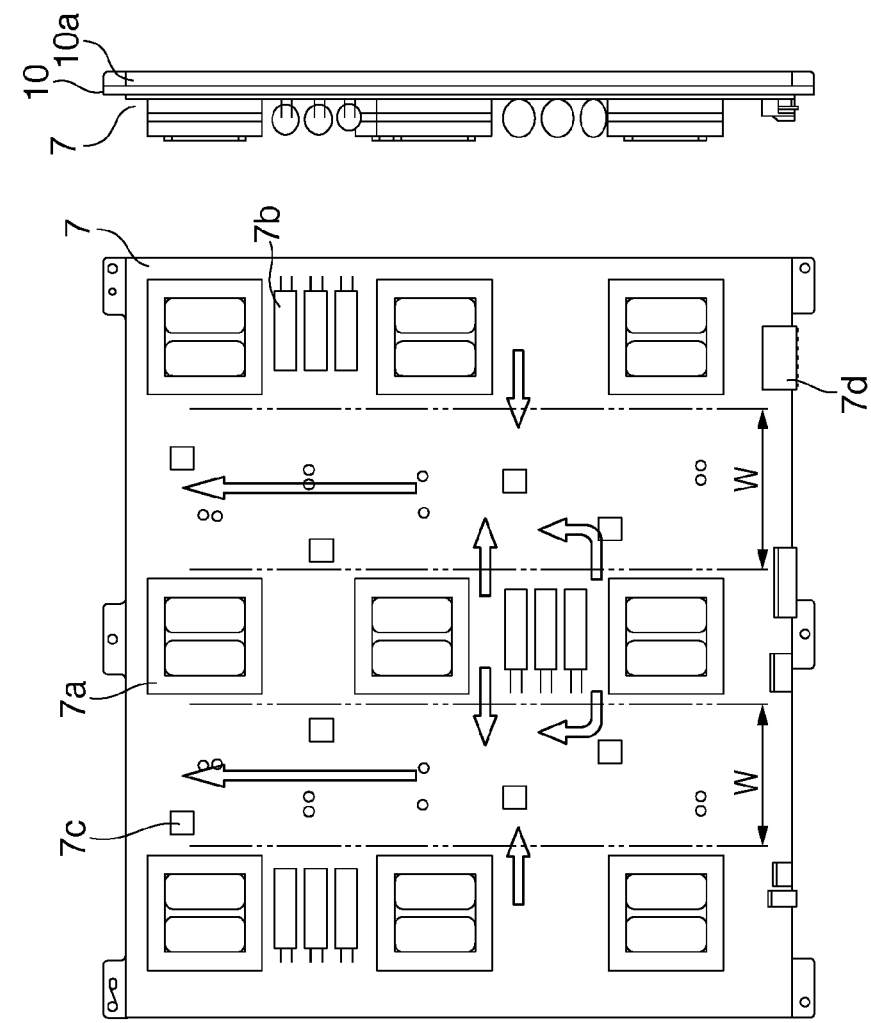

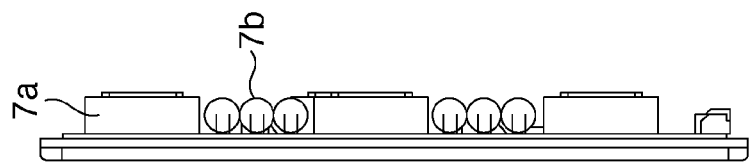
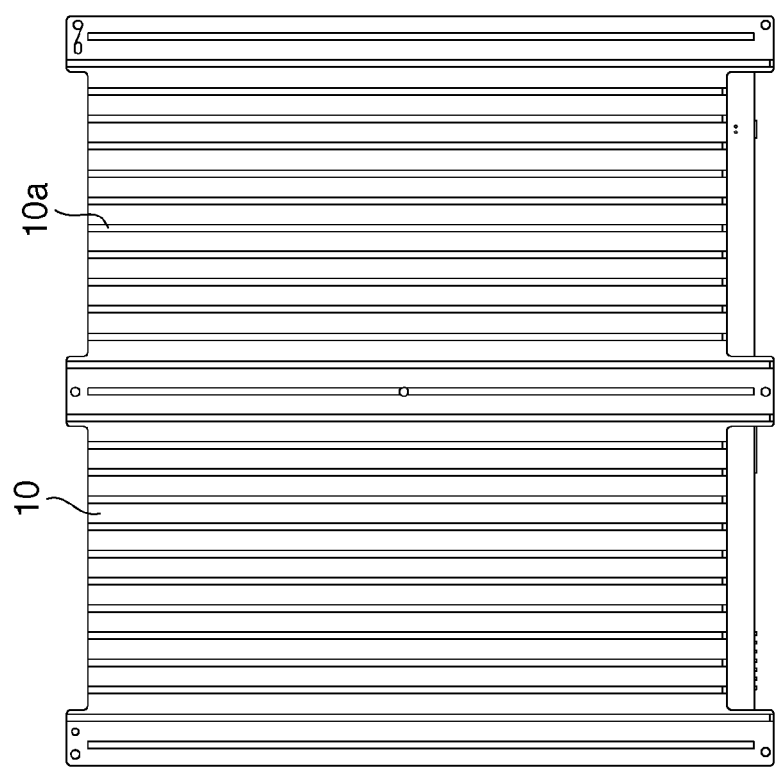

FLAT-PANEL DISPLAY APPARATUS INCLUDING A HEAT RADIATOR

BACKGROUND OF THE INVENTION

1. Field of the Invention

The present invention relates to a circuit board layout in a flat-panel display apparatus.

2. Description of the Related Art

A conventional flat-panel display apparatus is described with reference to FIGS. 10 and 11. FIG. 10 is a front view of a conventional flat-panel display apparatus, and FIG. 11 is an exploded perspective view of the apparatus.

Referring to FIGS. 10 and 11, a display panel 1 is an LCD panel or the like that displays images. A front bezel 2 is an exterior component that is arranged on the front of the display panel 1. A back chassis 5 holds the back of the display panel 1. A driver board 8 is supported on a back chassis 5 and drives the display panel 1 upon receipt of a control signal from a circuit board 14. The circuit board 14 is supported on the back chassis 5 and controls power supply to the display panel 1 and the driver board 8 and the output of display signals. Exhaust fans 15 are supported on the back chassis 5 and forcefully exhaust internal air. A rear cover 16 covers the driver board 8, the circuit board 14, and the exhaust fans 15 on the back chassis 5.

Although not shown, multiple circuit boards 14 are arranged above and below on the back chassis 5. Each circuit board 14 has multiple electrical components mounted thereon on the back side of the display panel. The circuit boards 14 are fixed with screws inserted into bosses provided in the back chassis 5. The circuit boards 14, the driver board 8 and so on are electrically connected to one another through cables and connectors, not shown. The front bezel 2 has an opening in the center so that the display panel 1 is exposed to the front. The rear cover 16 has vent-holes 16a and 16b for heat radiation in its lower and upper portions. The exhaust fans 15 are mounted on the back chassis 5 in the vicinity of the upper vent-holes 16b.

Japanese Patent Laid-Open No. 2002-341777 describes a configuration, different from the configuration shown in FIGS. 10 and 11, in which each circuit board is arranged so that the electrical components mounted thereon face away from the display panel; and multiple circuit boards are vertically arranged above and below at different intervals on the back side of the display panel. With this configuration, a circuit board arranged below and a circuit board arranged above can be cooled by producing two air flow layers that represent different spacings. Another configuration is also described, in which a radiator plate is attached to the inner face of a member that corresponds to the rear cover, and an elastic thermal-conductivity member is provided between electrical components.

With the above-described Japanese Patent Laid-Open No. 2002-341777, a further reduction in the dimension of the thickness of a display device is difficult because of different spacings between the component mounting surfaces of the upper and lower circuit boards and the back side of the display panel. If the above spacings are made the same, air flowing upward is heated by the heat generated by the electrical components mounted on the lower circuit board, which results in a reduction in the cooling effect of the upper circuit board. Besides, the upper circuit board is required to take some countermeasures such as mounting highly heat-resistant components that are capable of resisting the influence of the heat generated by the lower circuit board, which results in cost increases.

Meanwhile, further slimming down and higher functionality are desired in display panels for use in PCs and slim TVs and it is necessary to mount a larger number of electrical components in order to increase the scale of such display panels while pursuing the slimming down of such display panels. For this, the area and number of circuit boards must be increased, but at the same time there is a desire for a configuration that is capable of offering good heat radiation performance without increasing the thickness of a display panel, even though circuit boards are vertically arranged above and below.

In general, it is known that the heat radiation performance of electronic equipment degrades as the volume of the equipment decreases; however, pursuing the slimming down of display panels means reducing the device volume, which contradicts the desire for improved heat radiation performance.

SUMMARY OF THE INVENTION

The present invention has been made in view of the above-described problems and provides a configuration that ensures good heat radiation performance, even if the device volume is reduced, and that does not inhibit the slimming down of the device.

In order to solve the aforementioned problems, the present invention provides a flat-panel display apparatus comprising: a display panel; a circuit board arranged on a back side of a display unit of the display panel; and a cover that covers the back of the display panel and the circuit board, wherein the circuit board includes at least two circuit boards, a first circuit board and a second circuit board, and the first circuit board is arranged above the second circuit board so that, on the back side of the display panel, a mounting surface of the first circuit board and a mounting surface of the second circuit board are approximately in parallel with a display surface of the display unit and do not overlap each other; the first circuit board and the second circuit board each have a primary mounting surface on which a large number of electrical components are mounted, and a secondary mounting surface that is opposite the primary mounting surface and on which a smaller number of electrical components than on the primary mounting surface are mounted; the primary mounting surface of the first circuit board is arranged in an inverted orientation to the primary mounting surface of the second circuit board; and a radiator with fins is provided on the secondary mounting surface side of the first circuit board.

According to the present invention, a configuration that ensures good heat radiation performance, even if the device volume is reduced, and that does not inhibit the slimming down of the device can be achieved. It is also possible to avoid cost increases due to the mounting of highly heat-resistant components.

Further features of the present invention will become apparent from the following description of exemplary embodiments with reference to the attached drawings.

BRIEF DESCRIPTION OF THE DRAWINGS

FIGS. 1A and 1B are a front view and a rear view, respectively, of a flat-panel display apparatus according to an embodiment of the present invention.

FIGS. 4A and 4B are a plan view and a side view, respectively, of a signal processing board.

FIGS. 5A and 5B are a plan view and a side view, respectively, of a primary mounting surface of a power supply board.

FIGS. 6A and 6B illustrate, respectively, a secondary mounting surface of a power supply board and a cross-sectional view of the power supply board.

DESCRIPTION OF THE EMBODIMENTS

Embodiments of the present invention will be described in detail below with reference to the accompanying drawings.

The following embodiments are merely examples for practicing the present invention. The embodiments should be properly modified or changed depending on various conditions and the structure of an apparatus to which the present invention is applied. The present invention should not be limited to the following embodiments.

First Embodiment

Figure 2:
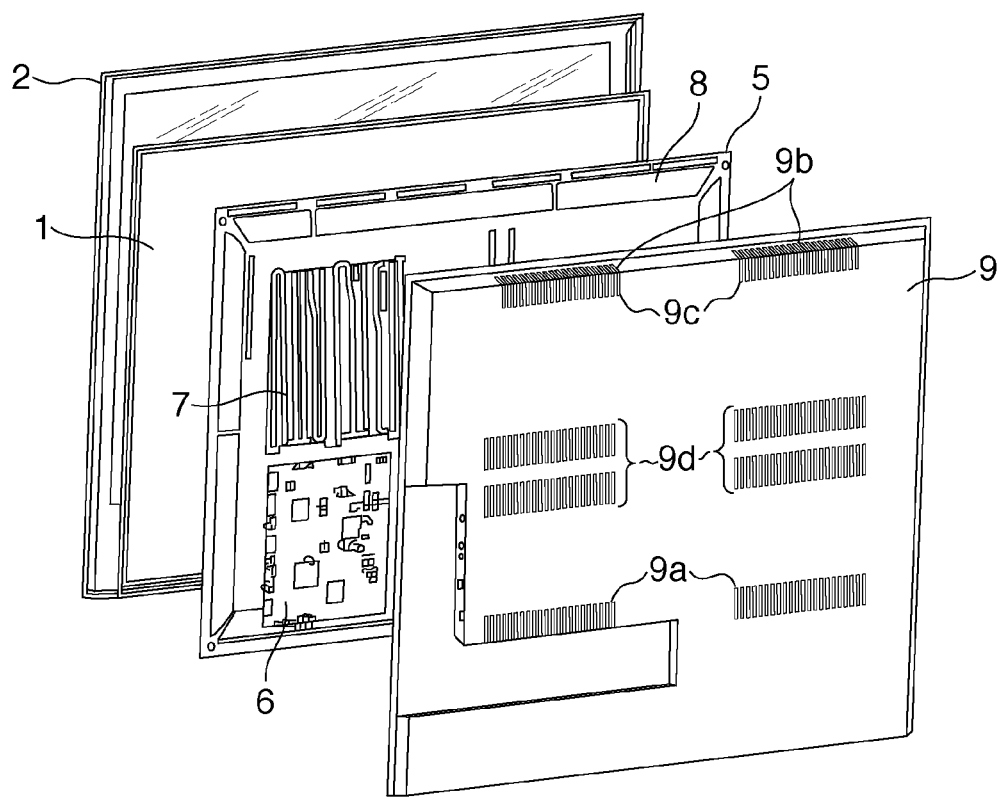
FIG. 2 is an exploded perspective view of the flat-panel display apparatus in FIG. 1A, as viewed from the rear.

FIGS. 1A and 1B are a front view and a rear view, respectively, of a flat-panel display apparatus according to an embodiment of the present invention; and FIG. 2 is an exploded perspective view of the flat-panel display apparatus in FIG. 1A, as viewed from the rear.

Referring to FIGS. 1A and 1B, a display panel 1 is configured such that, between two thin glasses called an anode and a cathode, display elements are arrayed in a lattice for each pixel and wired in a matrix; and provides display by controlling the driving of the display elements. The present embodiment takes as an example a field emission display in which the display panel 1 has a thickness of 5 mm and a diagonal display area of 50 inches. The display panel 1 has an anti-reflection film attached to its uppermost surface.

A front bezel 2 is an exterior component that covers an outer edge of the display panel 1 and has an opening formed in a portion corresponding to the display area of the display panel 1. A speaker 3 is arranged below the display panel 1. A stand 4 is provided to install a display panel unit on the floor or a base. The display panel unit includes the display panel 1, the front bezel 2, the speaker 3, circuit boards 6 to 8 that will be described later, and a rear cover 9. The rear cover 9 is an exterior component provided on the back of the display panel 1. The stand 4 is mountable onto and removable from the display panel unit and enables the display panel unit not only to be mounted in a stationary position but also to be installed hung on a wall. In particular, when hung on a wall, a display with a smaller thickness will have more design advantages because it can be installed so as to protrude less from the wall. Note that, although neither shown nor described in detail, the display device is equipped with various user-operable switches, indicators displaying a current operating state or current settings, a remote-control light-receiving unit, input and output units communicating with external devices, and so on.

Referring to FIG. 2, the back chassis 5 is a base for supporting the display panel 1, circuit boards arranged on the back side of the display panel 1, and any other components. A signal processing board 6 has input and output units that communicate with external devices; it corresponds to the above-described second circuit board that performs image input and output control, signal processing, and so on. A power supply board 7 corresponds to the above-described first circuit board that enables power supply necessary for unit operations. A driver board 8 drives the display panel 1 upon receipt of an output signal from the signal processing board 6 and is arranged on the outer edge of the display panel 1. Other components, such as substrates and the like that compensate for insufficient parts of a signal processing system and a power supply system not shown, are arranged in planes. The display panel 1 and the circuit boards 6 to 8 are electrically connected by connectors and cables not shown, thereby providing image display functionality.

Figure 3:
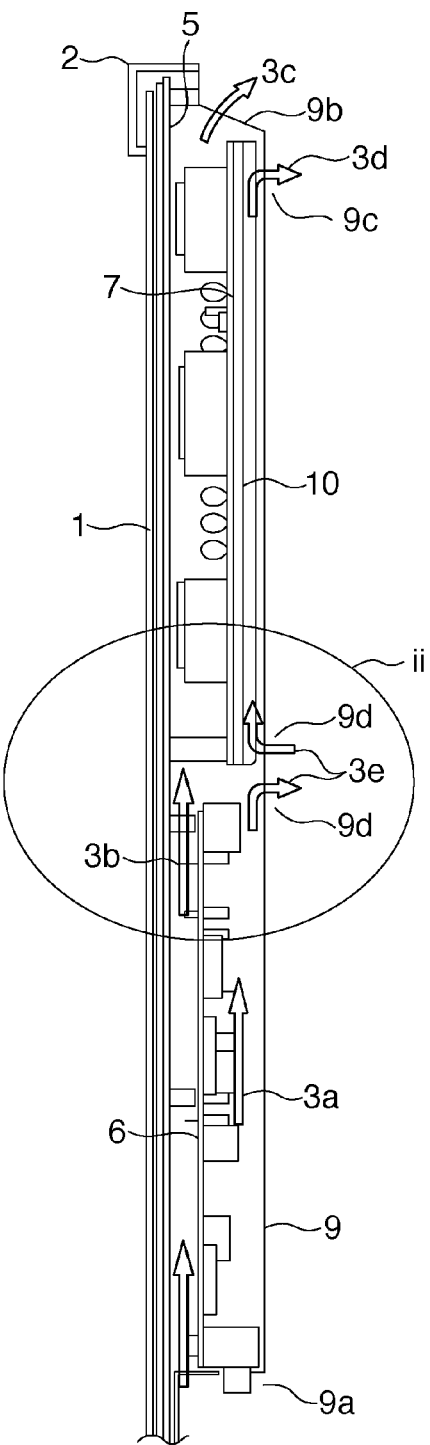
FIG. 3 is a cross-sectional view taken along line i-i in FIG. 1A.

The signal processing board 6 and the power supply board 7 are mounted on the back chassis 5 so as not to overlap each other, with the power supply board 7 arranged above and the signal processing board 6 arranged below. FIG. 3 is a cross-sectional view taken along line i-i in FIG. 1A.

The circuit board layouts are next described.

The signal processing board 6 is first described. FIGS. 4A and 4B are a plan view and a side view, respectively, of the signal processing board 6. Referring to FIG. 4B, a side A is a primary mounting surface, and a side B is the back of the primary mounting surface, namely, a secondary mounting surface. FIG. 4A illustrates the primary mounting surface. The primary mounting surface has almost all the electrical components necessary for electrical circuit configuration, such as connectors, capacitors, ICs, and chip parts. The primary mounting surface also comes with discrete components that are mounted by inserting lead legs 6a into lands. The lead legs 6a project through the secondary mounting surface and are electrically and mechanically mounted by soldering on the secondary mounting surface side. The lead legs 6a project approximately several millimeters from the secondary mounting surface. Because of this, a clearance is necessary between the back chassis 5 and the secondary mounting surface, and the back chassis 5 and the secondary mounting surface are mounted with a spacing of 8 mm therebetween. Although almost all electrical components are mounted on the primary mounting surface as described above, in some cases, a small number of electrical components may be mounted on the secondary mounting surface for reasons of circuit design.

Almost all of such electrical components mounted on the secondary mounting surface are chip parts, and they have a height of approximately 2 mm that is smaller than that of the above-mentioned lead legs 6a. The signal processing board 6 is provided with multiple input and output terminals 6c that can be interfaces to external devices. The input and output terminals 6c may, for example, be RCA composite terminals, antennas, HDMI terminals, LAN terminals, or the like, and they are configured so that, even if cables are connected to connectors, the cables are connected by L-angle connectors in parallel with the boards so as not to increase the thickness of the display device.

Of the electrical components mounted on the signal processing board 6, those that are mounted at a maximum height are included in the input and output terminals 6c; in the present example, the maximum height at which components are mounted is 15 mm. Other examples of electrical components that are mounted at high heights include heat-sink-equipped ICs, capacitors, and so on; however, since the signal processing board 6 requires only small-capacity capacitors and such capacitors are mounted at relatively low heights, the capacitors are mounted in their standing positions on the signal processing board 6.

The power supply board 7 is next described. A spacing between the power supply board 7 and the back chassis 5 is 15 mm, for example. FIGS. 5A and 5B are a plan view and a side view, respectively, of a primary mounting surface of the power supply board 7. FIGS. 6A and 6B illustrate, respectively, a secondary mounting surface of the power supply board 7 and a cross-sectional view of the power supply board 7.

Examples of electrical components mounted on the primary mounting surface of the power supply board 7 include transformers 7a, capacitors 7b, power transistors 7c, and L-angle connectors 7d; each kind of such electrical components is mounted in multiple locations. The electrical components have various specifications depending on circuit configuration, so components of a variety of sizes are used; for the purpose of slimming down a display device, components that will be mounted at low heights and methods for mounting components at low heights are selected. For example, considering the capacitors 7b or the like; if they are comparable in capacity to the components mounted on the signal processing board 6, they should be small in size and thus can be mounted in their standing positions; however, if they are larger in capacity, they are mounted laying down so as to ensure capacity along their length while keeping the outer diameter within the desired height. If the capacity is insufficient, a technique such as using multiple capacitors is employed. Similarly, the transformers 7a and other like components are also mounted in multiple locations in order to control their heights at which they are mounted.

On the secondary mounting surface side of the power supply board 7, as illustrated in FIGS. 6A and 6B, an aluminum-alloy radiator 10 with fins 10a is provided to cover almost the entire secondary mounting surface. A thermal-conductivity sheet (not shown) is also provided between the secondary mounting surface of the power supply board 7 and the radiator 10, for the purpose that the radiator 10 can efficiently conduct heat generated by the secondary mounting surface. The radiator 10 provided on the secondary mounting surface side has a thickness of 2 mm in flat portions and the fins 10a have a height of 6 mm, so that the total thickness of the radiator 10 is 8 mm, which is equivalent to the above-mentioned spacing between the signal processing board 6 and the back chassis 5. The fins 10a have a width of 1.5 mm and are arranged with 9.5-mm pitches so that the spacing between the walls of fins is 8 mm. By covering almost the entire board area with the radiator 10, a sufficient number of fins 10a can be ensured even though the fins 10a are provided with the above-mentioned pitches that allow enough air to flow; accordingly, the radiator 10 can offer good heat radiation performance. Note that, although the radiator 10 may desirably be provided to cover almost the entire surface as described above, it is not an absolute necessity. As long as the required level of heat radiation is achieved, the radiator 10 may be provided only on a part of the secondary mounting surface of the power supply board 7. While the present embodiment employs the above-described thermal-conductivity sheet, this thermal-conductivity sheet is not an absolute necessity. It is conceivably possible that the secondary mounting surface and the radiator 10 may be in direct contact with each other; or, as in the present embodiment example, a heat-producing member and a heat-radiating member may be in indirect contact with each other with the use of a thermal-conductivity sheet, for the purpose of reducing contact thermal resistance. Although the secondary mounting surface of the power supply board 7 also has small components and in part has portions where the leads project through the surface, any problem can be avoided by applying spot facing to corresponding portions of the radiator 10 or by forming holes in corresponding portions. Providing the radiator 10 on almost the entire secondary mounting surface can reduce an increase in board temperature caused by an increase in the temperature of the electrical components mounted on the power supply board 7, and at the same time, can reduce an increase in the temperature of those electrical components because the heat generated by the components can be dissipated toward the radiator 10 on the power supply board 7.

The component layout on the primary mounting surface of the power supply board 7 is next described. In FIGS. 5A and 5B, electrical components that are mounted at high heights on the primary mounting surface of the power supply board 7 include the transformers 7a, the capacitors 7b, and so on; in the present embodiment, the transformers 7a are mounted at, for example, a height of 13 mm and the capacitors 7b are mounted laying down at, for example, a height of 11 mm (equivalent to their outer diameter). The power transistors 7c are mounted at low heights, that is, 3 mm, but produce a considerable amount of heat.

In the present embodiment, the power transistors 7c and other components that are mounted at low heights are scattered on air flow paths W of a predetermined width that extend vertically across the power supply board 7 illustrated in FIGS. 5A and 5B, and such air flow paths W are provided in two locations. In this way, components mounted at low heights are arranged on the air flow paths W and components, such as the transformers 7a, that are mounted at relatively high heights are arranged on both sides of the air flow paths W. The spacing between the back chassis 5 and the primary mounting surface of the power supply board 7 is 15 mm, for example. From this, the back chassis 5 and the above-mentioned components mounted at high heights have small clearances therebetween; for example, the spacing between the transformers 7a and the back chassis 5 is 2 mm, which is insufficient to expect enough air flow. Aside from this, if portions where enough air flows cannot be obtained are arranged without any order, but with priority given to the convenience of other features such as a circuit pattern, portions with high resistance to air flow will undesirably be provided in various locations on the circuit board.

Contrary to this, if components mounted at low heights are arranged on the air flow paths W as described above, portions with low resistance to air flow can be provided on the circuit board, forming a vertical passage. In addition, since the air flow paths W are sandwiched between the components mounted at relatively high heights on both sides of the air flow paths W, the air flow paths W are formed like tubular chimneys. The heat generated by the power transistors 7c that produce a large amount of heat propagates through air toward both the radiator 10 and the back chassis 5; the air heated by the power transistors 7c can flow without any resistance by virtue of the lack of air flow inhibition around them, and additionally, the flow rate is high because of the chimney effect. This further improves the effect of cooling the power transistors 7c and also facilitates drawing of the air flowing on both sides of the air flow paths W and of the air flowing on the side of the signal processing board 6 due to an increase in negative pressure, thus further improving the effect of cooling the entire board. The wide arrows in FIG. 5A schematically indicate such air flows.

The power supply board 7 produces a larger amount of heat than the signal processing board 6. In the present embodiment, the secondary mounting surface of the signal processing board 6 is arranged to face the back chassis 5 and the primary mounting surface of the power supply board 7 is arranged to face the back chassis 5, so that the primary mounting surface of the signal processing board 6 is in an inverted orientation to the primary mounting surface of the power supply board 7 and that the signal processing board 6 and the power supply board 7 are vertically staggered so as not to overlap each other. Additionally, the heights at which electrical components are mounted on the power supply board 7 are determined by the location of the secondary mounting surface of the signal processing board 6, in order to create a space that enables air to flow between the signal processing board 6 and the back chassis 5. Moreover, because the clearance between the secondary mounting surface of the signal processing board 6 and the back chassis 5 is made approximately equal to the thickness of the radiator 10 mounted on the power supply board 7, a resultant thickness will be the same as in the case where the two boards are arranged with their primary mounting surfaces in the same orientation with respect to the back chassis 5. In addition, the clearance between the air flow paths W of the power supply board 7 and the back chassis 5 is larger than the clearance between the signal processing board 6 and the back chassis 5. While almost all the heat generated by the circuit boards is due to the electrical components mounted on the boards, no radiator similar in configuration to the radiator 10 is provided on the secondary mounting surface side of the signal processing board 6. Thus, this configuration can reduce the number of components. With the above-mentioned configuration, the heat generated by the electrical components on the signal processing board 6 propagates through the air toward the primary mounting surface of the signal processing board 6, and moves upward. However, the power supply board 7 on the upper side has a higher heat radiation effect because of the heat radiation effect of the radiator 10 that distributes the received heat between the heat led to the secondary mounting surface side and the heat propagating through the air toward the primary mounting surface side, thus achieving a sufficient heat radiation effect with consideration given to the heat generated by the signal processing board 6.

Referring to FIG. 3, the rear cover 9 has vent-holes 9a to 9d that enables air to flow, formed in parts that correspond to upper and lower end portions of the signal processing board 6, a portion above the power supply board 7, and upper and lower end portions of the power supply board 7. The vent-hole 9a formed near the lower end portion of the signal processing board 6 is an intake vent, and the vent-hole 9b formed near the upper end portion of the power supply board 7 is an exhaust vent. The outside air incoming through the vent-hole 9a is split into air flowing on the primary mounting surface side of the signal processing board 6 and air flowing on the secondary mounting surface side thereof. The air flowing on the primary mounting surface side of the signal processing board 6 flows toward the radiator 10 of the power supply board 7 as shown by the arrow 3a, and the air flowing on the secondary mounting surface side of the signal processing board 6 flows toward the primary mounting surface of the power supply board 7 as shown by the arrow 3b. At this time, air flow resistance is high in portions other than the air flow paths W of the power supply board 7, but through the air flow paths W, air can flow almost without any resistance because, as mentioned above, a desired clearance is provided between the back chassis 5 and the power supply board 7. Besides, although the temperature of the air flowing as shown by the arrow 3a is increased by the heat generated by the signal processing board 6, the temperature of the air flowing as shown by the arrow 3b is kept close to the outside-air temperature up to the time when the air flows to the power supply board 7 side. Accordingly, air at a temperature equivalent to the low temperature of the outside air is led into the power supply board 7, which prevents an increase in the temperature of the power supply board 7. In addition, the arrangement of the power transistors 7c that produce a large amount of heat on the air flow paths W, through which air flows at a high rate because of the chimney effect, improves the efficiency of cooling. Air is exhausted through the vent-hole 9b as shown by the arrow 3c.

The fins 10a of the radiator 10 extend from the bottom to the top and their intervals are determined so as enable the natural convection of air. The vent-holes 9c and 9d are provided in portions of the rear cover 9 that correspond to the upper and lower end portions of the radiator 10; above the radiator 10, air is exhausted as shown by the arrow 3d, and below the radiator 10, the vent-hole 9d that also serves as the exhaust vent of the signal processing board 6 generates the flows as shown by the arrows 3e.

From the above description, the height of the electrical components that are mounted at a maximum height on the primary mounting surface of the signal processing board 6 and the height of the tips of the fins 10a on the power supply board 7, as viewed from the back chassis 5, are the same, that is, 23 mm, so the height is the same as if only either one of the boards were provided.

The present embodiment can achieve a flat-panel display apparatus that is capable of introducing air at a temperature equivalent to the temperature of outside air into the primary mounting surface of the upper circuit board and offers sufficient heat radiation performance, without increasing the thickness of a display device.

Second Embodiment

A second embodiment is next described. The same components as those in the first embodiment are denoted by the same reference numerals as used in the first embodiment and the description thereof is omitted herein.

Figure 7:
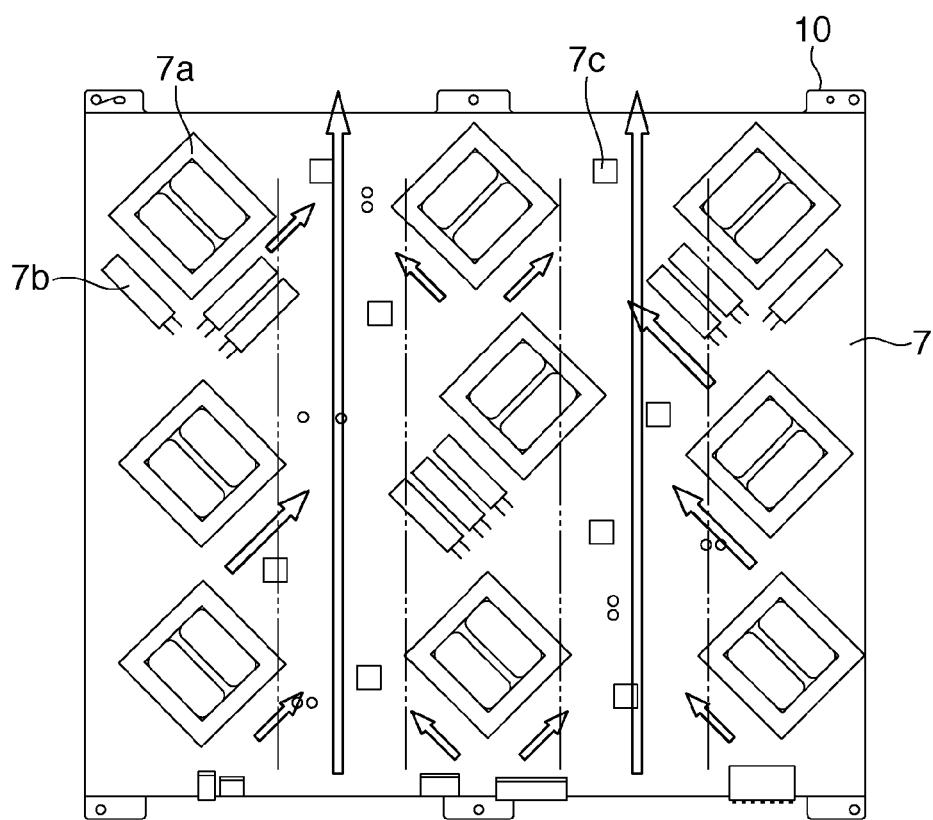
FIG. 7 is a plan view of a primary mounting surface of a power supply board, which is equivalent to FIG. 5A.

FIG. 7 is a plan view of the primary mounting surface of the power supply board 7, which is equivalent to FIG. 5A. In the present example, the electrical components such as the transformers 7a and the capacitors 7b that are mounted at high heights are arranged at angles to the direction of air flow along the air flow paths W. Specifically, the transformers 7a of nearly rectangular parallelepiped shape are mounted with their sides at an angle of approximately 45° to the horizontal and vertical directions. Similarly, the capacitors 7b of circular cylinder shape are mounted with their axis at an angle of approximately 45°.

Figure 8:
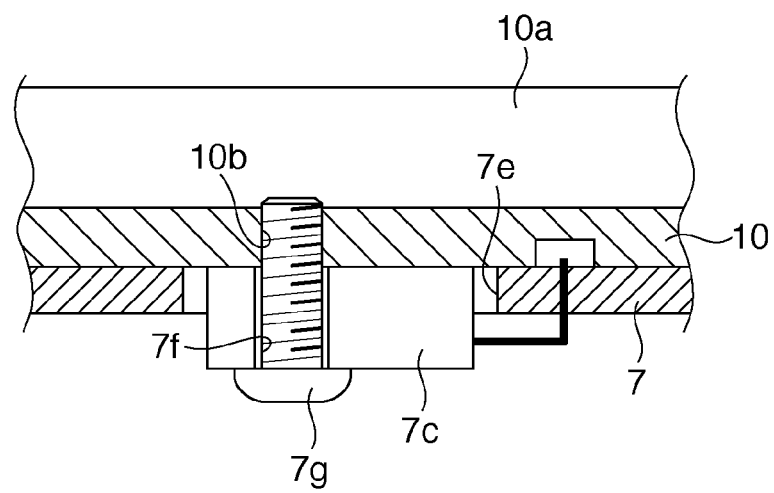
FIG. 8 is a cross-sectional view of a surface portion where a power transistor 7c is mounted.

FIG. 8 is a cross-sectional view of a portion where a power transistor 7c is mounted. In FIG. 8, a through hole 7e is formed in the mounting surface of the power supply board 7 on which the power transistor 7c is mounted, and a flat portion of the radiator 10 on the side opposite from the fins 10a is exposed through this through hole 7e. Furthermore, screw-down taps 10b are provided in exposed portions of the flat portion of the radiator 10. The power transistors 7c are of the type including a screw-fixing through hole 7f, and the above-described screw-down taps 10b are approximately coaxial with the screw-fixing through holes 7f of the power transistors 7c, so the power transistors 7c are fixed with screws 7g in contact with the radiator 10. Note that, if a thermal-conductivity sheet is arranged between the power supply board 7 and the radiator 10, the configuration may be such that through holes are also formed in the thermal-conductivity sheet or such that the power supply board 7 is in thermal conductive contact with the radiator 10, that is, the power supply board 7 is in indirect contact with the radiator 10 with its screws in contact with the thermal-conductivity sheet. In the present invention, not only direct contact but also indirect contact using thermal conduction, for example, can be implemented.

Since the air heated inside the apparatus tends to flow upward, the resistance in the air-flow direction can be reduced more than in the case where relatively large components such as the transformers 7a and the capacitors 7b are arranged with their sides or axes at an angle of 0° or 90° to the horizontal or vertical direction (parallel or perpendicular to the air-flow direction). Moreover, since the power transistors 7c that produce a large amount of heat can be mounted with screws 7g in contact with the back-side large radiator 10, an increase in the temperature of the power transistors 7c can be further reduced.

The present embodiment can achieve a flat-panel display apparatus that has a further improved heat radiation effect, as compared with the apparatus of the first embodiment, by reducing the resistance to air flow and preventing an increase in the temperature of mounted components. Note that fixing members are apparently not limited to screws.

Third Embodiment

A third embodiment is next described. According to the third embodiment, an air flow regulator with thermal insulation properties is arranged between the upper end portion of the signal processing board 6 and the lower end portion of the power supply board 7 and in contact with the lower end portion of the radiator 10. A cable holding unit is also provided to hold cables, with which the circuit boards are electrically connected, in the vicinity of the rear cover 9. In the following, the same components as those in the first embodiment are denoted by the same reference numerals and the description thereof is omitted herein.

Figure 9:
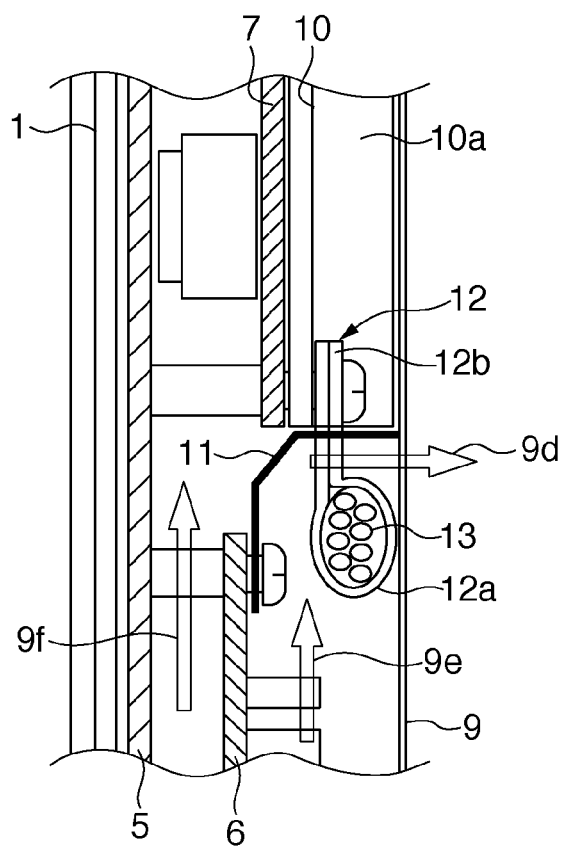
FIG. 9 is an enlarged view of a portion corresponding to a portion ii in FIG. 3.
Figure 10:
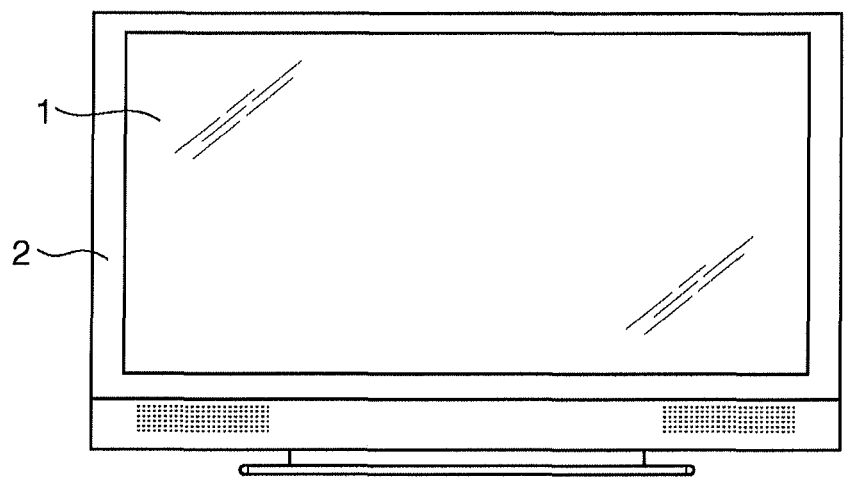
FIG. 10 is a front view of a conventional flat-panel display apparatus.
Figure 11:
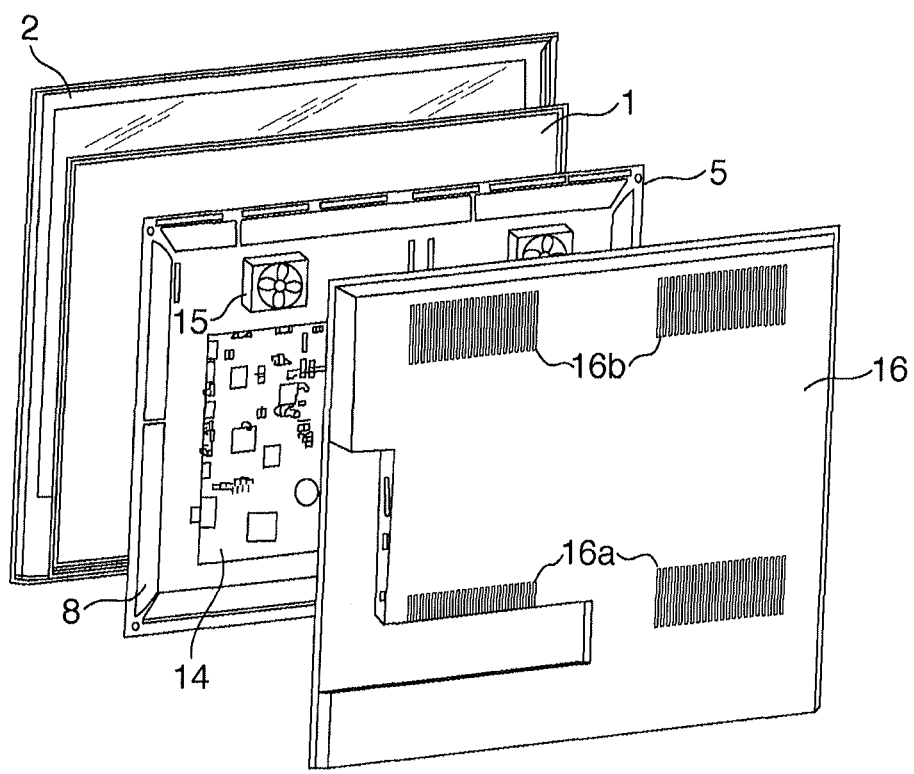
FIG. 11 is an exploded perspective view of a conventional flat-panel display apparatus.

FIG. 9 is an enlarged view of a portion that is equivalent to a portion ii in FIG. 3. Referring to FIG. 9, 11 is an air flow regulator of a resin plate material, 12 is a cable holding unit, and 13 is a cable group. The cable group 13 provides electrical connection between the boards; in a space between the upper end portion of the signal processing board 6 and the lower end portion of the power supply board 7, multiple cables extend approximately in the vertical direction with respect to the plane of the drawing. The air flow regulator 11 approximately in the shape of letter L is arranged so that the letter L is turned upside downs, with its one end portion fixed with a screw to the upper end portion of the signal processing board 6 where the signal processing board 6 is mounted on the back chassis 5. The other end portion of the air flow regulator 11 is arranged so as to lightly push and press the lower end portion of the radiator 10 through its own elasticity. The cable holding unit 12 is made of a resin; a cable holding part 12a is approximately in the shape of a circular cylinder and an arm 12b that extends from the circular-cylindrical cable holding part 12a is fixed with screws between fins of the radiator 10. A through hole is provided in a portion of the other end portion of the air flow regulator 11 that intersects with the arm 12b, so that the arm 12b can communicate with the radiator 10. The cable holding unit 12 is spaced approximately 10 mm from the air flow regulator 11 and is held at a position quite close to the rear cover 9.

With the above configuration, the flow of air that has passed through the signal processing board 6 with its temperature increasing is regulated in the vicinity of the air flow regulator 11 and changes its direction toward the rear cover 9 as shown by the arrow 9d, which enables the air to be exhausted from the vent-hole 9d of the rear cover 9 and prevents the increased temperature from flowing toward the power supply board 7. Since the cable holding unit 12 is spaced away from the air flow regulator 11, it does not inhibit the flow of air but enables air to be exhausted as shown by the arrow 9e. The other end portion of the air flow regulator 11 and the low end portion of the radiator 10 are in pressure contact with each other through the elasticity of the air flow regulator 11. This prevents foreign matter or the like that has entered from the vent-holes 9b and 9c in the upper portion of the rear cover 9 between the fins 10a of the radiator 10 from entering the primary mounting surface of the signal processing board 6.

In many cases, cables that provide electrical connection between circuit boards are usually rounded along the surface of the back chassis 5; in the present example, however, the cable group 13 is held on the rear cover side apart from the back chassis 5. This prevents air flow between the back chassis 5 and the signal processing board 6 from being inhibited by cables and the like. Accordingly, air flowing between the back chassis 5 and the signal processing board 6 can flow into the primary mounting surface side of the power supply board 7 without any resistance as shown by the arrow 9f. The air flowing between the back chassis 5 and the signal processing board 6 has a temperature close to the outside air temperature, because it is less affected by the heat generated by the signal processing board 6. The third embodiment can thus achieve a flat-panel display apparatus that has a further improved cooling effect than the apparatus described in the first embodiment.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2009-003998, filed Jan. 9, 2009, which is hereby incorporated by reference herein in its entirety.

What is claimed is:

1. A flat-panel display apparatus comprising:
a display panel;
a first circuit board and a second circuit board respectively fixed on a back side of a display unit including the display panel; and
a cover that covers the back side of the display unit and the first circuit board and the second circuit board,
wherein
the first circuit board and the second circuit board are approximately in parallel with the display panel and not overlapped with each other;
the first circuit board is arranged on an upper side on the back side of the display unit;
the first circuit board and the second circuit board respectively have a mounting surface on which electrical components are mounted;
the mounting surface of the first circuit board is arranged to face in an opposite direction from the mounting surface of the second circuit board;
a distance between the first circuit board and the display unit is different from a distance between the second circuit board and the display unit;
a cooling unit which radiates heat generated from electrical components on the mounting surface of the first circuit board is provided, the cooling unit being arranged behind the first circuit board and not arranged behind the second circuit board;

a space that allows air to flow is provided on the back surface side of the second circuit board and the back surface side of the first circuit board;

a vent-hole is provided in the cover; and an air flow regulator that regulates an air flow on the mounting surface side of the second circuit board is arranged between the first circuit board and the second circuit board, the air flow regulator being fixed on a portion of the second circuit board.

2. The apparatus according to claim 1, wherein the second circuit board is arranged closer to the display unit than the first circuit board.

3. The apparatus according to claim 1, wherein the air flow regulator is fixed on the upper end portion of the second circuit board and being in contact with a lower end portion of the cooling unit provided on the first circuit board.

4. The apparatus according to claim 1, wherein the electrical components mounted on the mounting surface of the first circuit board are arranged so as to form a vertically extending air flow path.

5. The apparatus according to claim 4, wherein electrical components mounted on both sides of the air flow path along the mounting surface of the first circuit board are arranged at an angle to horizontal and vertical directions.

6. The apparatus according to claim 1, wherein a through hole, through which an electrical component generating heat is arranged with a fixing member so as to be in contact with the cooling unit, is formed in a primary mounting surface of the first circuit board.

7. The apparatus according to claim 1, wherein a cable holding unit that holds a cable that provides an electrical connection between the first circuit board and the second circuit board is arranged in a space between the cover and the mounting surface of the second circuit board.

8. The apparatus according to claim 1, wherein the cover has vent-holes formed in parts that correspond to upper and lower end portions of the first circuit board and upper and lower end portions of the second circuit board.

9. The apparatus according to claim 1, wherein the display unit further includes a back chassis that supports the back of the display panel, and the second circuit board is mounted on the back chassis.

10. The apparatus according to claim 1, wherein the cooling unit covers a substantial portion of the first circuit board and includes a plurality of fins extending from a bottom of the cooling unit to a top of the cooling unit.

11. A flat-panel display apparatus comprising:

a display panel;

a first circuit board and a second circuit board respectively fixed behind a display unit including the display panel; and a cover that covers a back side of the display unit and the first circuit board and the second circuit board, wherein the first circuit board and the second circuit board are approximately in parallel with the display panel and not overlapped with each other;

the first circuit board is arranged on an upper side of the second circuit board on the back side of the display unit;

the first circuit board and the second circuit board respectively have a mounting surface on which electrical components are mounted;

the mounting surface of the first circuit board and the back surface of the second circuit board are arranged to face the back side of the display unit;

a distance between the first circuit board and the display unit is different from a distance between the second circuit board and the display unit; and a cooling unit which radiates heat generated from the electrical components on the mounting surface of the first circuit board is provided, the cooling unit being arranged behind the first circuit board and not arranged behind the second circuit board;

a space that allows air to flow is arranged on the back surface side of the second circuit board and the back surface side of the first circuit board;

a vent-hole is formed in the cover; and an air flow regulator that regulates an air flow on the mounting surface side of the second circuit board is arranged between the first circuit board and the second circuit board, the air flow regulator being fixed on a portion of the second circuit board.

12. The apparatus according to claim 11, wherein the second circuit board is arranged closer to the display panel than the first circuit board.

13. The apparatus according to claim 11, wherein the electrical components mounted on the mounting surface of the first circuit board are arranged so as to form a vertically extending air flow path.

14. The apparatus according to claim 13, wherein electrical components mounted on both sides of the air flow path along the mounting surface of the first circuit board are arranged at an angle to horizontal and vertical directions.

15. The apparatus according to claim 11, wherein a through hole, through which an electrical component generating heat is arranged with a fixing member so as to be in contact with the cooling unit, is formed in the mounting surface of the first circuit board.

16. The apparatus according to claim 11, wherein a cable holding unit that holds a cable that provides an electrical connection between the first circuit board and the second circuit board is arranged in a space between the cover and the mounting surface of the second circuit board.

17. The apparatus according to claim 11, wherein the cover has vent-holes formed in parts that correspond to upper and lower end portions of the first circuit board and upper and lower end portions of the second circuit board.

18. The apparatus according to claim 11 wherein the display unit further includes a back chassis that supports the back of the display panel, and the second circuit board is mounted on the back chassis.

19. The apparatus according to claim 11, wherein the first circuit board is arranged above the second circuit board.

20. The apparatus according to claim 11, wherein the cooling unit covers a substantial portion of the first circuit board and includes a plurality of fins extending from a bottom of the cooling unit to a top of the cooling unit.

* * * * *